(12) United States Patent
Hsu et al.

(10) Patent No.: US 11,521,691 B1
(45) Date of Patent: Dec. 6, 2022

(54) TRIGGERING NEXT STATE VERIFY IN PROGRAM LOOP FOR NONVOLATILE MEMORY

(71) Applicant: SanDisk Technologies LLC, Addison, TX (US)

(72) Inventors: Hua-Ling Hsu, Fremont, CA (US); Henry Chin, Fremont, CA (US); Han-Ping Chen, San Jose, CA (US); Erika Penzo, San Jose, CA (US); Fanglin Zhang, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 8 days.

(21) Appl. No.: 17/336,936

(22) Filed: Jun. 2, 2021

(51) Int. Cl.
| | |
|---|---|
| *G11C 16/04* | (2006.01) |
| *G11C 16/34* | (2006.01) |
| *G11C 16/10* | (2006.01) |
| *G11C 16/24* | (2006.01) |
| *G11C 11/56* | (2006.01) |
| *H01L 27/11565* | (2017.01) |
| *G11C 16/26* | (2006.01) |
| *H01L 27/11582* | (2017.01) |

(52) U.S. Cl.
CPC ...... *G11C 16/3459* (2013.01); *G11C 11/5628* (2013.01); *G11C 11/5671* (2013.01); *G11C 16/0483* (2013.01); *G11C 16/10* (2013.01); *G11C 16/24* (2013.01); *G11C 16/26* (2013.01); *H01L 27/11565* (2013.01); *H01L 27/11582* (2013.01)

(58) Field of Classification Search
CPC ............ G11C 16/3459; G11C 11/5628; G11C 11/5671; G11C 16/0483; G11C 16/10; G11C 16/24; G11C 16/26
USPC .................................................... 365/185.03
See application file for complete search history.

(56) References Cited

U.S. PATENT DOCUMENTS

| | | | | |
|---|---|---|---|---|
| 11,361,834 B1 * | 6/2022 | Kumar | ................... | G11C 16/24 |
| 2009/0257280 A1 * | 10/2009 | Oh | ......................... | G11C 16/10 |
| | | | | 365/185.18 |
| 2020/0321055 A1 | 10/2020 | Yang | | |

* cited by examiner

*Primary Examiner* — Tha-O H Bui
(74) *Attorney, Agent, or Firm* — Dickinson Wright PLLC; Steven C. Hurles

(57) ABSTRACT

Apparatus and methods are described to program memory cells and control bit line discharge schemes during programming based on the data pattern. The memory controller can predict program data pattern based on SLC pulse number and TLC data completion signals and use these signals to adjust when the inhibited bit lines can discharge. Once a TLC program operation have more one data, the memory controller will enable EQVDDSA_PROG to equalize to VDDSA, and then discharge. In SLC program, the memory controller will enable EQVDDSA_PROG only in first program pulse and disable it thereafter.

20 Claims, 18 Drawing Sheets

|  | S0 | S1 | S2 | S3 | S4 | S5 | S6 | S7 |
|---|---|---|---|---|---|---|---|---|
| UPPER PAGE | 1 | 1 | 1 | 0 | 0 | 0 | 0 | 1 |
| MIDDLE PAGE | 1 | 1 | 0 | 0 | 1 | 1 | 0 | 0 |
| LOWER PAGE | 1 | 0 | 0 | 0 | 0 | 1 | 1 | 1 |

TRIGGERING NEXT STATE VERIFY IN PROGRAM LOOP FOR NONVOLATILE MEMORY

BACKGROUND

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. Memory devices always strive for improved efficiency and speed of operation.

SUMMARY

Various embodiments are described herein for operating a nonvolatile memory, e.g., a NAND, a BICS memory or the like.

According to an aspect of the present disclosure, an apparatus is provided that includes a plurality of memory cells that are configured to store multiple states. The apparatus further includes a memory controller that is operably connected to the plurality of memory cells to control storage of data therein. The controller is configured to apply a programming control signal to selected bit lines to program selected memory cells of the plurality of memory cells and apply an inhibit control signal to unselected memory cells of the plurality of memory cells to block programming of the unselected memory cells. The controller is further configured to disable an equalization signal applied to the selected bit lines after initial program pulses are applied to the selected memory cells. The controller is further configured to enable the equalization signal applied to the selected bit lines once a threshold number of program pulses is met.

According to another aspect of the present disclosure, the memory controller is configured to set the threshold of program pulses to a number at which at least half of the plurality of memory cells are programmed to respective final memory states.

According to yet another aspect of the present disclosure, the memory controller is further configured to disable the equalization signal to reduce power consumption and reduce inhibit memory cell disturb.

According to still another aspect of the present disclosure, the memory controller is configured to control programming of a single level cell and disable the equalization signal for a first programming pulse.

According to a further aspect of the present disclosure, the memory controller is configured to enable bit line equalization after a second programming pulse or a later programming pulse.

According to yet a further aspect of the present disclosure, the memory controller is configured to control programming of a single level cell on a partial page by selectively enabling and disabling the equalization signal for predetermined programming pulses.

According to still a further aspect of the present disclosure, the memory controller is configured to control programming of a triple level cell and disable the equalization signal for the first three programming pulses.

According to another aspect of the present disclosure, the memory controller is configured to enable the equalization after C level programming is completed.

According to yet another aspect of the present disclosure, the memory controller is configured to disable the equalization after F level programming is completed.

According to still another aspect of the present disclosure, the memory controller is configured to control programming of a quad level cell, disable the equalization signal for at least a first programming pulse, enable the equalization signal after S7 programming is completed, and disable the equalization signal after S13 programming is completed.

According to a further aspect of the present disclosure, the memory controller is configured to control programming a quad level cell using MLS/fine programming, disable the equalization signal for at least a first programming pulse, enable the equalization signal after A programming is completed, and disable the equalization signal after C programming is completed.

Yet another aspect of the present disclosure is related to a nonvolatile memory control method. The method includes the step of applying a select control signal to selected bit lines to address selected memory cells of the plurality of memory cells to program the selected memory cells. The method continues with the step of applying an inhibit control signal to unselected memory cells of the plurality of memory cells to block programming to the unselected memory cells. The method proceeds with the step of disabling a discharge of the selected bit lines until after initial program pulses are applied to the selected memory. The method continues with the step of enabling a discharge of the selected bit lines once a threshold of program pulses is met.

According to another aspect of the present disclosure, the step of enabling a discharge of the selected bit lines includes equalizing the bit lines to VDDSA before discharging the bit lines.

According to yet another aspect of the present disclosure, the method further includes the step of setting the threshold of program pulses to a number at which at least half of the memory cells are programmed to respective final memory states.

According to still another aspect of the present disclosure, the method further includes the step of controlling programming a single level cell and wherein disabling the discharge of the selected bit lines includes disabling the discharge for a first programming pulse.

According to a further aspect of the present disclosure, the method further includes the step of controlling programming of a triple level cell and wherein disabling the discharge of the selected bit lines includes disabling discharge of the bit lines for the first three programming pulses.

According to yet a further aspect of the present disclosure, enabling the discharge of the selected bit lines further includes enabling the disabled bit lines for discharge after C programming is completed.

According to still a further aspect of the present disclosure, the step of disabling the discharge of the selected bit lines includes disabling the previously enabled bit lines after F programming is completed.

Yet another aspect of the present disclosure is related to a nonvolatile memory control method. The method includes the step of setting a program pulse count to zero. The method proceeds with the step of performing a program pulse with a bit line at a program level. The method continues with the step of incrementing the programming pulse count. With the programming pulse count below a first threshold, the method proceeds with disabling bit line discharge between programming pulses and then performing a subsequent programming pulse by returning performing a program pulse with a bit line at a program level. With the programming pulse count at or above a first threshold, the method continues with the step of enabling bit line discharge between programming pulses and then returning performing a program pulse with a bit line at a program level and incrementing the program pulse count. With the programming pulse count above a second threshold, the method continues with disabling bit line discharge between programming pulses.

According to another aspect of the present disclosure, the step of performing the programming pulses includes performing programming pulses for a QLC memory, setting the first threshold at the S7 program pulse level and setting the second threshold at the S13 programming pulse level.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Figure 1:
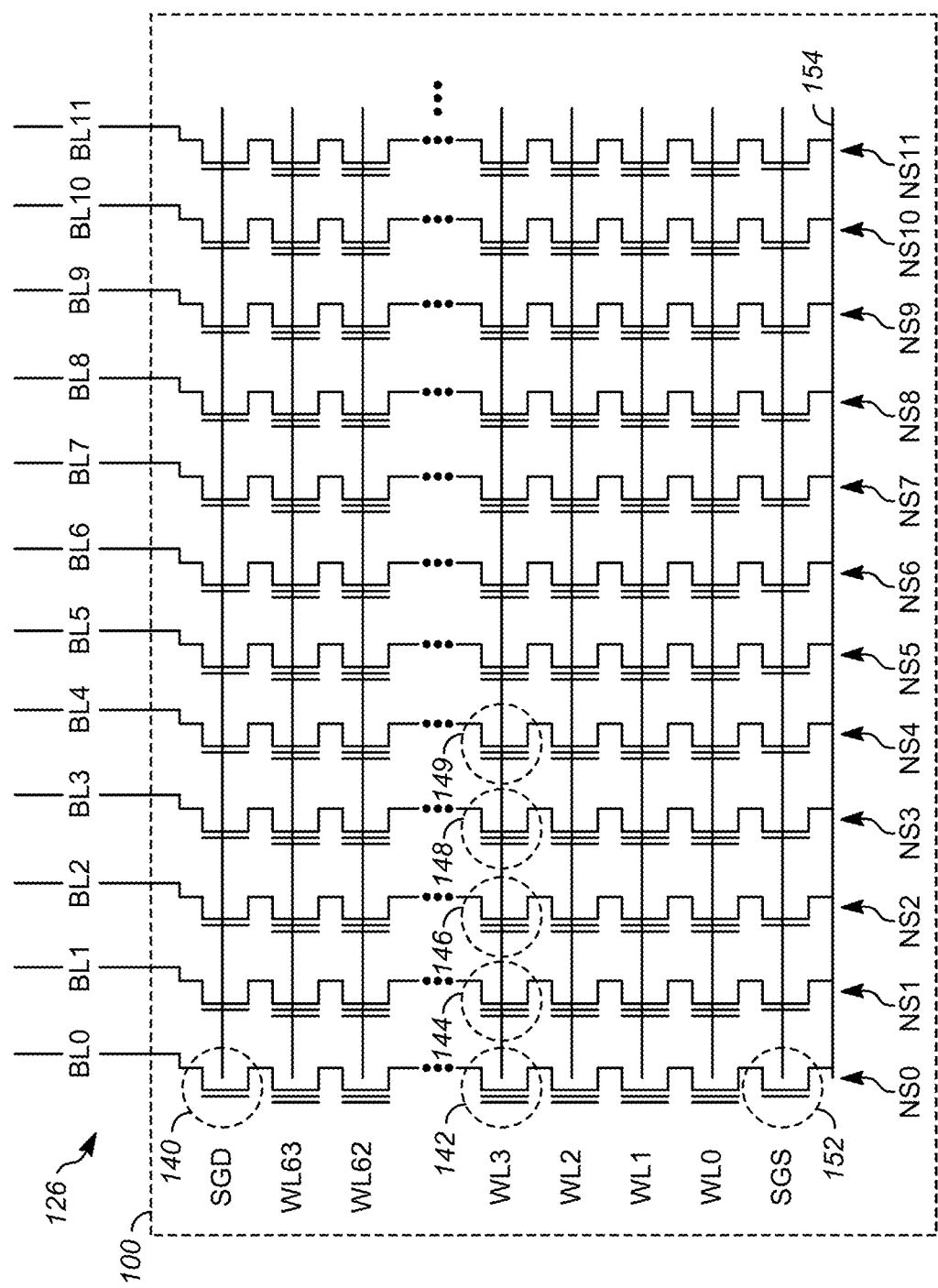
FIG. 1 illustrates an embodiment of an array of memory cells including bit and word lines according to an example embodiment.

Systems and methods are described for controlling the program operations of nonvolatile memory to adjust the bit line (BL) discharge scheme at least in part based on the data pattern being programmed into the associated memory cells. In an example embodiment, the memory controller circuitry can predict the program data pattern based on the program pulse number and data completion signals. Embodiments described herein will improve the programming time (Tprog) by reducing bit line discharge time by controlling the voltage equalization enable time. The present methodology may enable the elimination of the program disturb. In operation multilevel cell (e.g., triple level cell) program with more than one data bit, the controller circuitry can enable equalization data latch voltage (EQVDDSA) during program on the bit line and equalize to VDDSA then discharge. In operation of single level cell (SLC), program the signal enable (EQVDDSA_PROG) is only used in the first program pulse. The programming operations for both single level cell and multilevel cells each use multiple loops that each include a program pulse and a verify operation.

Each memory cell may be associated with a memory state according to write data in a program command, that has multiple loops of program pulse and verify. As used herein, a "memory state" is a detectable characteristic of a memory cell (e.g., a threshold voltage of a NAND memory cell, a resistance of a ReRAM memory cell, a magnetization state of a magnetoresistive random access memory) that may be used to represent a data value, such as a binary data value, including more than one binary bit. As used herein, the detectable characteristic of a memory cell used to represent a data value is referred to as a "programming characteristic." Based on write data in a program command, a memory cell will either remain in the erased state or be programmed to a memory state (a programmed memory state) different from the erased state.

For example, in a two-bit per cell (MLC) memory device, there are four memory states including the erased state and three programmed memory states. In a three-bit per cell (TLC) memory device, there are eight memory states including the erased state and seven programmed memory states. In a four-bit per cell (QLC) memory device, there are sixteen memory states including the erased state and fifteen programmed memory states. Programming the cells to each of these memory states requires multiple loops of program pulses and verify stages.

When a program command is issued, the write data are stored in data latches associated with the memory cells. For example, in a two-bit per cell memory device, each memory cell is associated with two data latches (e.g., DL1, DL2) that store the two-bit write data for the memory cell. Likewise, in a three-bit per cell memory device, each memory cell is associated with three data latches (e.g., DL1, DL2, DL3) that store the three-bit write data for the memory cell. Similarly, in a four-bit per cell memory device, each memory cell is associated with four data latches (e.g., DL1, DL2, DL3, DL4) that store the four-bit write data for the memory cell. Examples of data latches can be found in U.S. Pat. No. 10,535,401, which is incorporated by reference herein.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including MLC, TLC, QLC, and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, a triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
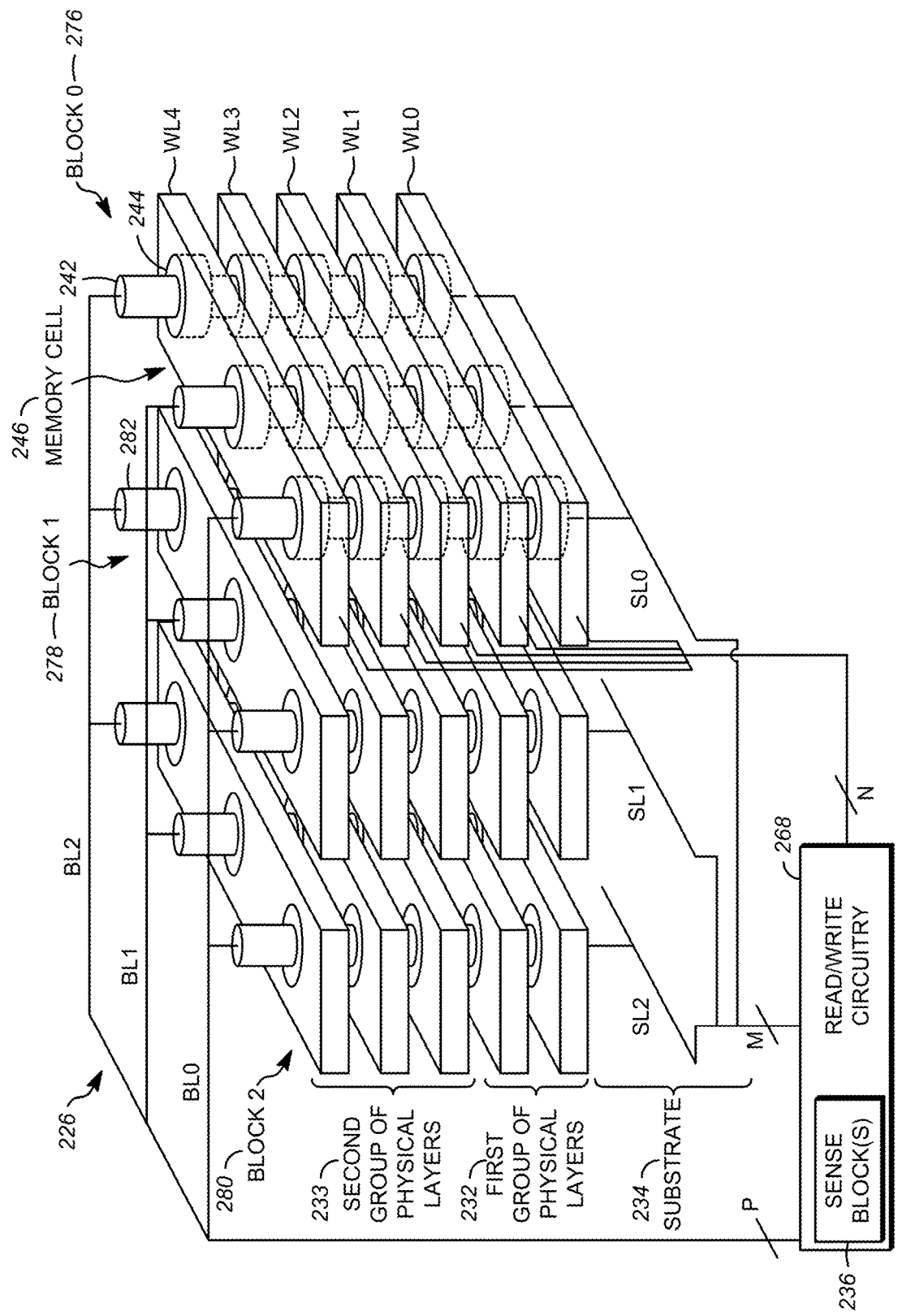
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 (which can be part of a controller) is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 268 can also perform verify operations as part of the programming operation.

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
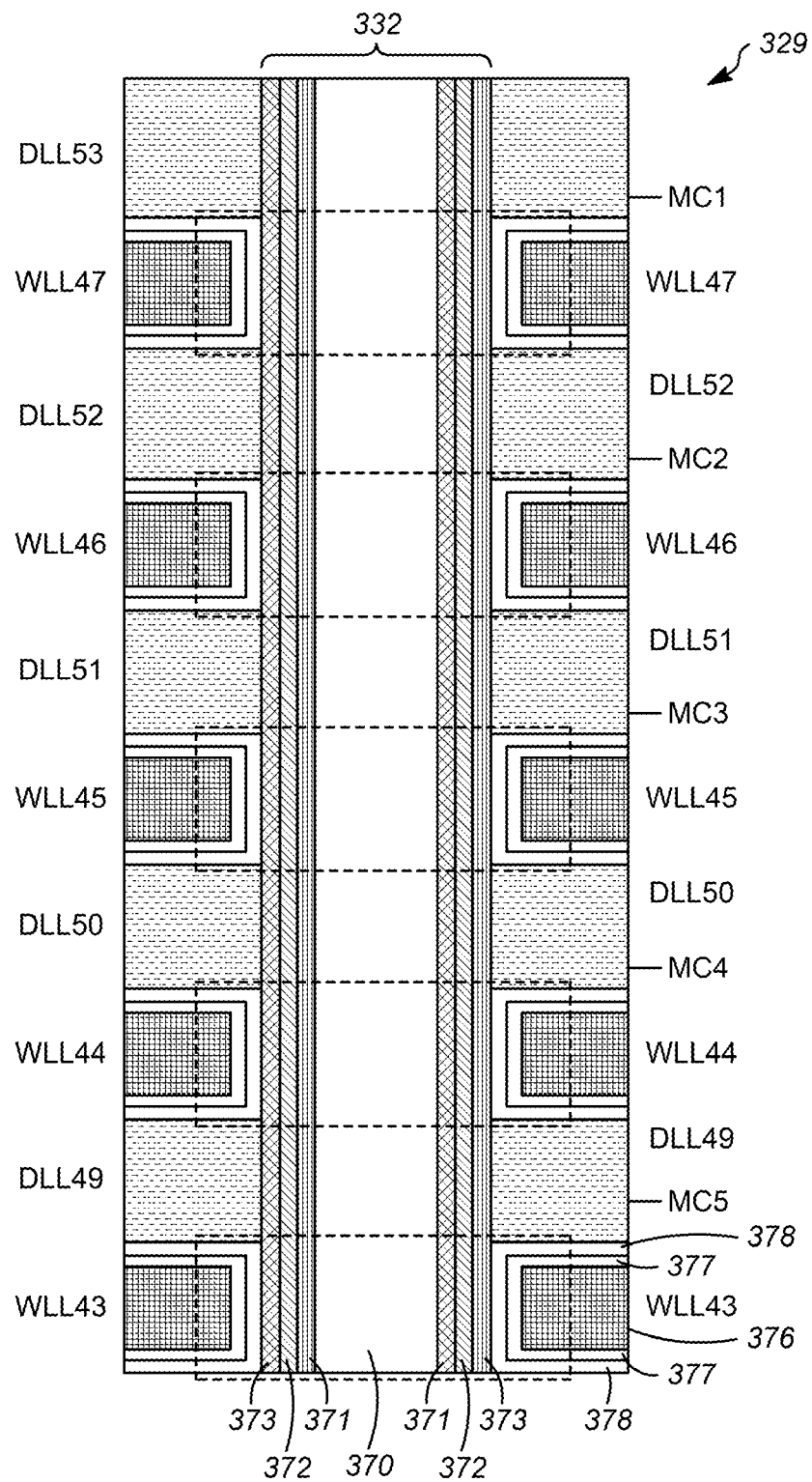
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes forty-eight storage cells.

Figure 4:
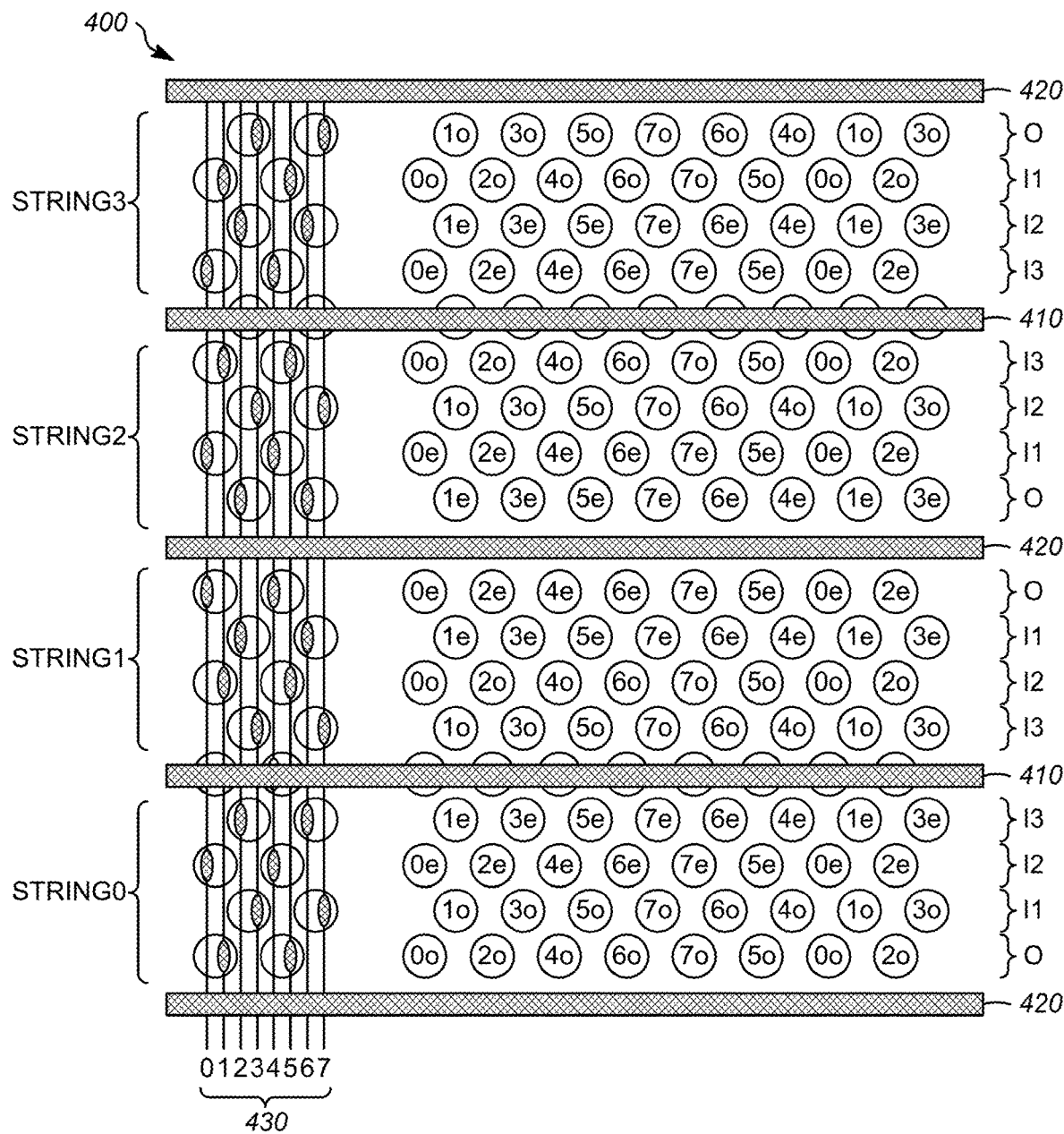
FIG. 4 illustrates a diagram showing a top view of a 3D memory block according to an example embodiment.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a shallow etching feature 410 (e.g., called SHE), and a deep etching feature 420 (e.g., called ST). The IO groups adjacent to a deep etching feature 420 are labeled outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each. These smaller groups can be arranged in tiers. The tiers can include the memory cells associated with the holes designated by the same designated circles in FIG. 4. The memory cells labeled as 2o are part of a same tier. The memory cells labeled 3e are part of another tier. The memory cells labeled as 2e are part of a same tier. The memory cells labeled 3o are part another tier. As explained herein, the controller can select a single tier for a program verify operation when the program verify level is unlikely to find an overprogrammed state or when the single tier is representative of the other tiers. At least one intermediate level for program verify is a multiple tier verify operation.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
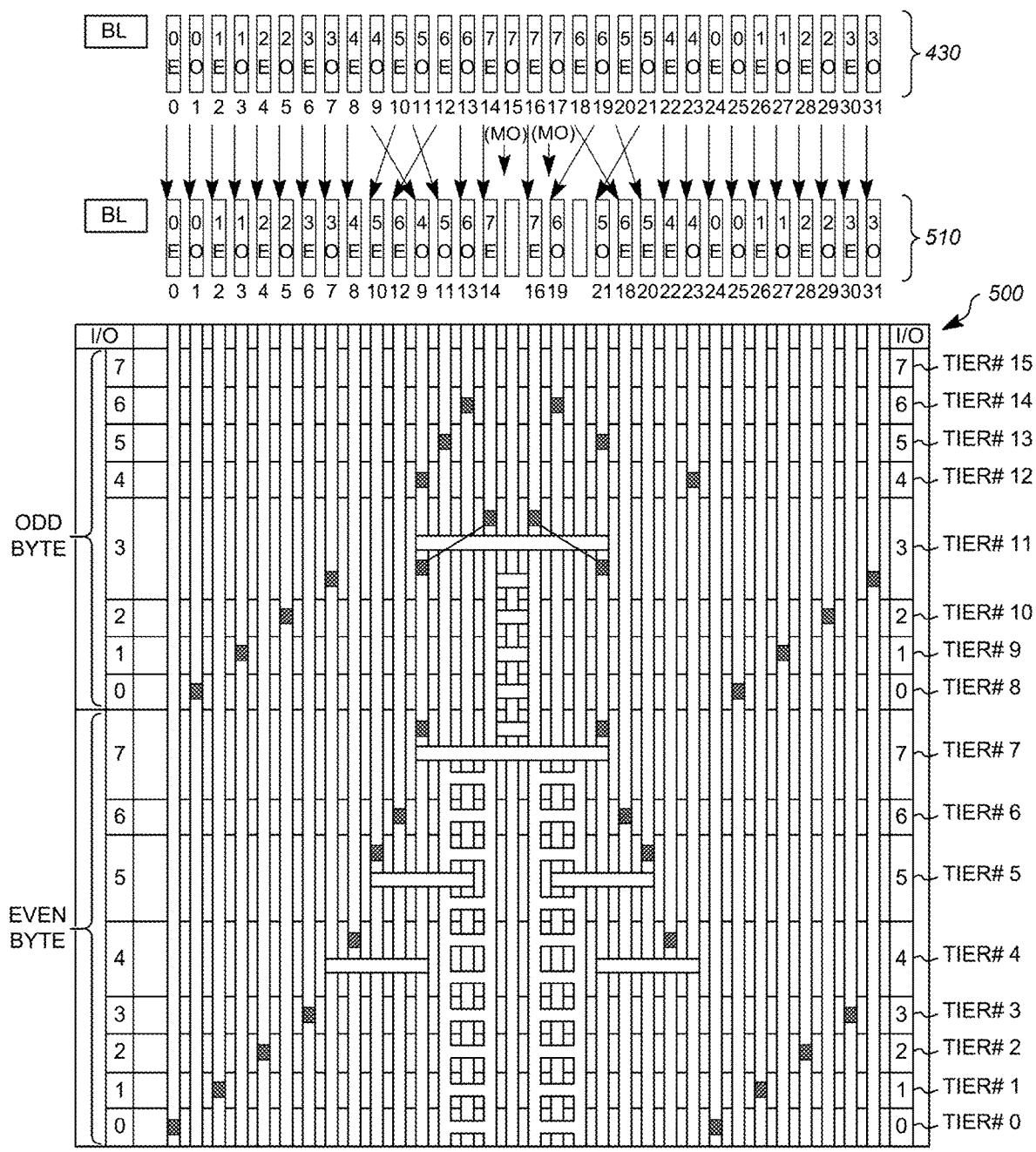
FIG. 5 illustrates an array of sense amplifier groups according to an exemplary embodiment for the 3D memory block of FIG. 4.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier #0 to Tier #15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like.

Figure 6:
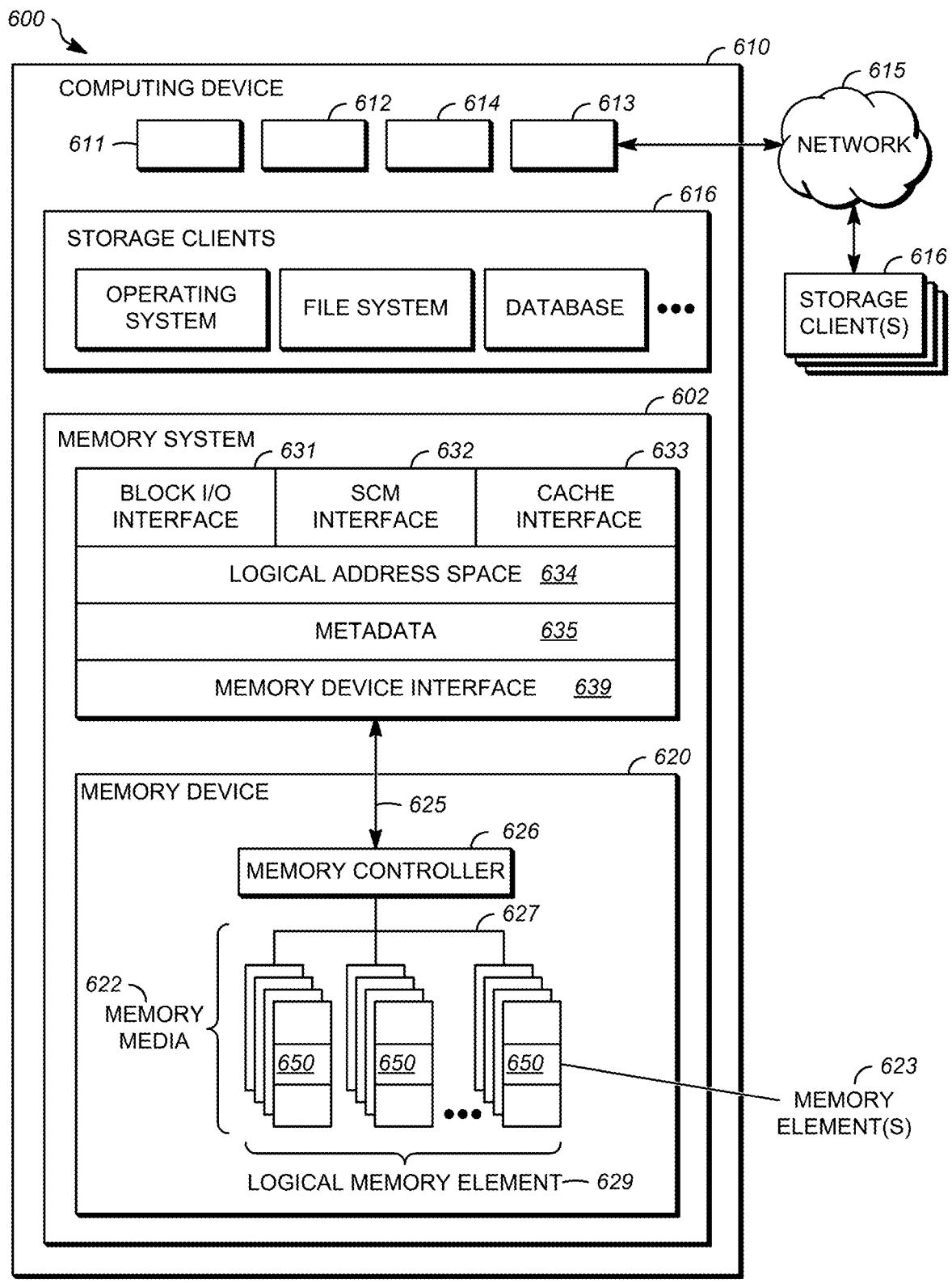
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. The computing device 610 comprises one or more identification circuits or tier selection circuits 650 for memory media 622 of a non-volatile and/or volatile memory device 620. As used herein, an "tier circuit" refers to a circuit utilized to identify a particular tier of memory cells (e.g., a 2o tier memory cells) in relation to at least one other subgroup or tier of memory cells and select the identified tier of memory cells for use in at least one programming operation, e.g., program verify. The tier selection circuits can operate to select a single tier for some program verify levels and multiple tiers for other program verify levels in a same verify operation. At least one verify is a single tier verify, e.g., the A or first program verify level. The first program verify level can be the lowest voltage. In an example embodiment, the last program verify level is also a single tier verify operation. In an example embodiment, at least one intermediate program verify is performed on multiple tiers.

A tier selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626 can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an I node, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device (s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, Infiniband, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620.

Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
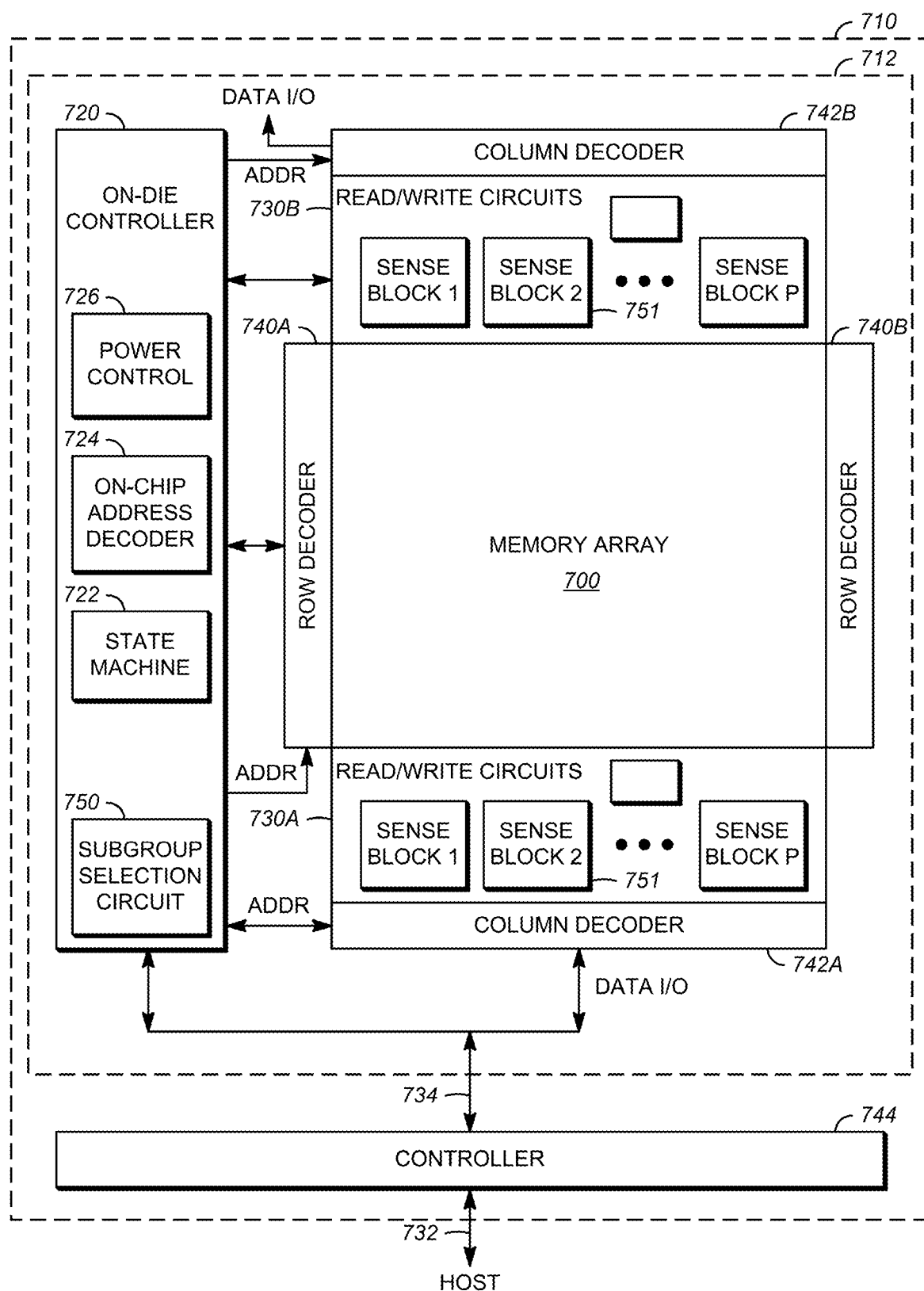
FIG. 7 illustrates a schematic block diagram of nonvolatile storage device for memory cell subgroup identification and selection.

FIG. 7 is a schematic block diagram illustrating an embodiment of a non-volatile storage device 710, which can perform programming and verify operations as described herein. The non-volatile storage device 710 can include one or more memory die or chips 712A "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/ 740B and by bit lines via column decoder circuits 742A/ 742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720 (e.g., controller circuitry), in one embodiment, cooperates with the read/write circuits 730A/ 730B to perform memory operations on the memory array 700. The on-die controller 720, in certain embodiments, includes a state machine 722, an on-chip address decoder 724, a power control circuit 726, and a subgroup selection circuit 750. In one embodiment, the on-chip address decoder 724 and/or the power control circuit 726 can be part of and/or controlled by the controller 744. The on-die controller 720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage. The state machine can be used to count the bitscans and compare the result to the threshold value, which can be stored in the state machine. The state machine can also trigger the program verify operation to skip to the next memory level verify operation when the bitscan count exceeds the threshold value.

In an embodiment, one or any combination of the on-die controller 720, state machine 722, power control circuit 726, on-chip address decoder 724, decoder circuit 742A, decoder circuit 742B, decoder circuit 740A, decoder circuit 740B, read/write circuits 730A, read/write circuits 730B, and/or controller 744 can be referred to as one or more managing circuits or generally as a controller circuitry.

Figure 8:
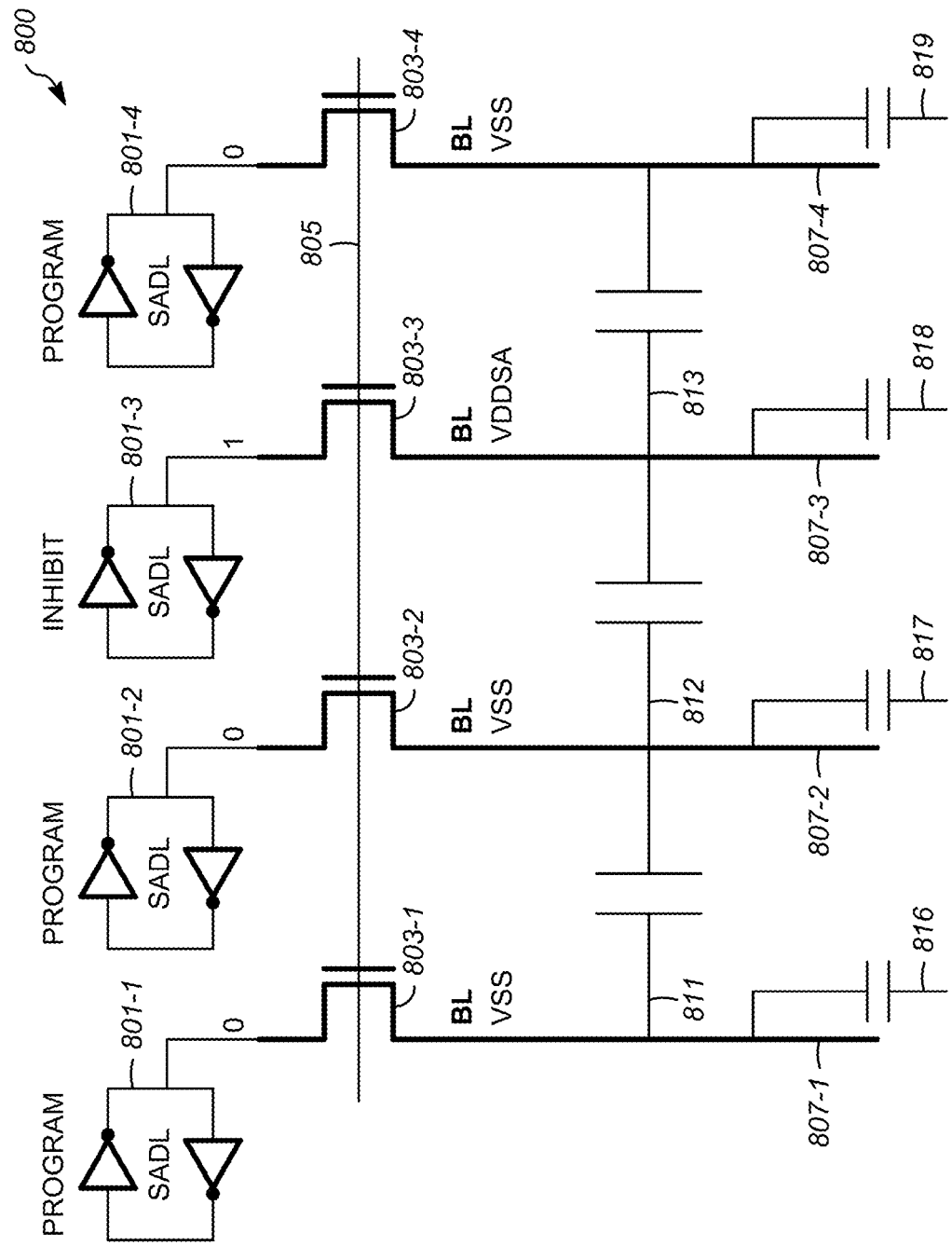
FIG. 8 illustrates a schematic view of the memory according to an example embodiment.

FIG. 8 shows a schematic view of nonvolatile memory 800 at a first state. The memory is simplified for ease of explanation. The first state of memory 800 shows that more program data from the sense amplifier data latches (SADL) 801-1, 801-2, 801-3, 801-4, which are each connected to the bit lines 807-1, 807-2, 807-3, 807-4 through an access transistor (e.g., a source gate drain SGD transistor) 803-1, 803-2, 803-3, 803-4. A bit select line 805 connects to the gate of the access transistor. The memory cells are schematically shown at 816, 817, 818, and 819. The memory cells 816, 817, and 819 are being programmed, e.g., with multiple program pulses that are followed with verify signals at lower voltages than the program pulses. In the example state of memory 800, the first circuit string connected to SADL 801-1 is set to a program state with the bit line 807-1 at Vss voltage level. The second circuit string connected to SADL 801-2 is set to a program state with the bit line 807-2 at Vss voltage level. The third circuit string connected to SADL 801-3 is set to an inhibit state with the bit line 807-3 at VDDSA voltage level. The fourth circuit string connected to SADL 801-4 is set to a program state with the bit line 807-4 at Vss voltage level. The bit lines 807-1, 807-2, 807-3, 807-4 are positioned close to one another and, hence have a parasitic capacitance, here capacitor 811 between bit line 807-1 and bit line 807-2, capacitor 812 between bit line 807-2 and bit line 807-3, and capacitor 813 between bit line 807-3 and bit line 807-4. In the first state, there is no capacitance at capacitor 811 as both bit lines 807-1 and 807-2 are at the same signal level, here Vss. There is capacitance at capacitors 812, 813 as both adjacent pairs of bit lines 807-2, 807-3 and bit lines 807-3, 807-4 have different voltages on those lines. The voltage VDDSA on bit line 803-3 is an inhibit signal. Vss is a program signal. Accordingly, there is capacitance loading (parasitic capacitance between adjacent bit lines) when EQVDDSA is applied to one or more of non-adjacent bit lines. In each program pulse, the program bit lines are at Vss level, and the inhibit BLs are at VDDSA level. This will occur during the first program pulses to program memory cells, e.g., SLC, TLC or other multilevel nonvolatile memory cells. This is due to there being more memory cells being programmed at the start of a programming operation, e.g., there is more program data than inhibit data. This is especially true for earlier pulses on TLC or multilevel cell programming operations. In operation, a signal EQVDDSA will short all bit lines, e.g., lines 803-1, 803-2, 803-3, 803-4 and then slowly charge up the bit lines to VDDSA level, then discharge after program pulse. The signal EQVVDDSA can be sent from the SADL side of the memory 800. The equalization operation involves applying a VDDSA voltage to all of the bit lines 807-1, 807-2, 807-3, 807-4 via a common EQ2VDDSA transistor and via respective BLX transistors.

This operation and structure of the memory 800 results in more capacitance loading if more BLs are at Vss level. The initial equalization level is low due to more bit lines at Vss, which can cause inhibit cell disturb. In operation, Vss (program voltage) is less than the bit line voltage, which is less than VDDSA (inhibit voltage). VDDSA is the higher inhibit voltage from the SADL and can be the sense amp data latch voltage to inhibit programming.

Figure 9:
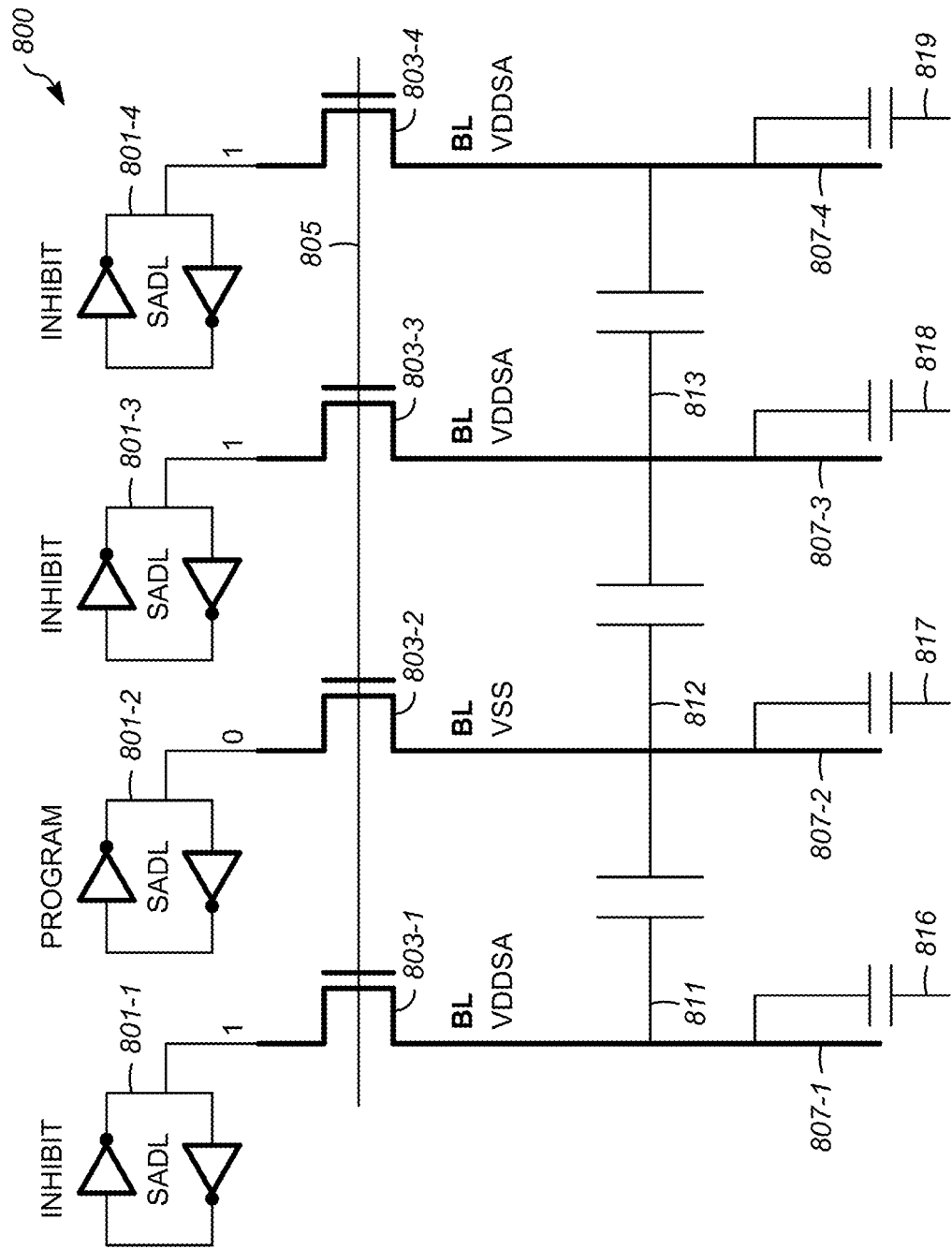
FIG. 9 illustrates a schematic view of the memory according to an example embodiment.

FIG. 9 shows a schematic view of nonvolatile memory 800 at a second state, i.e. later in the programming cycle after at least one program pulse or after multiple program pulses. In an example, the program pulses are at least half done, i.e., programming is approximately halfway to completion. As a result there, are more inhibit data signals VDDSA (bit lines 807-1, 807-3, 807-4) than program signals Vss (bit line 807-3). The second state of memory 800 includes more inhibit data than program data and is on the later programming pulses of the programming operation. The capacitive loading is less because most of the bit lines are already at VDDSA level. The initial equalization level is high due to more bit lines at the VDDSA level. Also, memory cells 816, 818 and 819 are being inhibited from being programmed.

In operation of the memory 800, the equalization of the bit lines is controlled depending on the program data, e.g., if there are more program states (FIG. 8) or more inhibit states (FIG. 9). However, if the bit lines are equalized too early, inhibit cells disturb may occur. When bit lines are charged up to VDDSA, there can be more loading by the capacitance between the bit lines. Here, EQVDDSA is disabled to conserve Icc (power supply current) and prevent read error which could occur if leftover charges in the bit lines are not discharged prior to a read operation.

Figure 10:
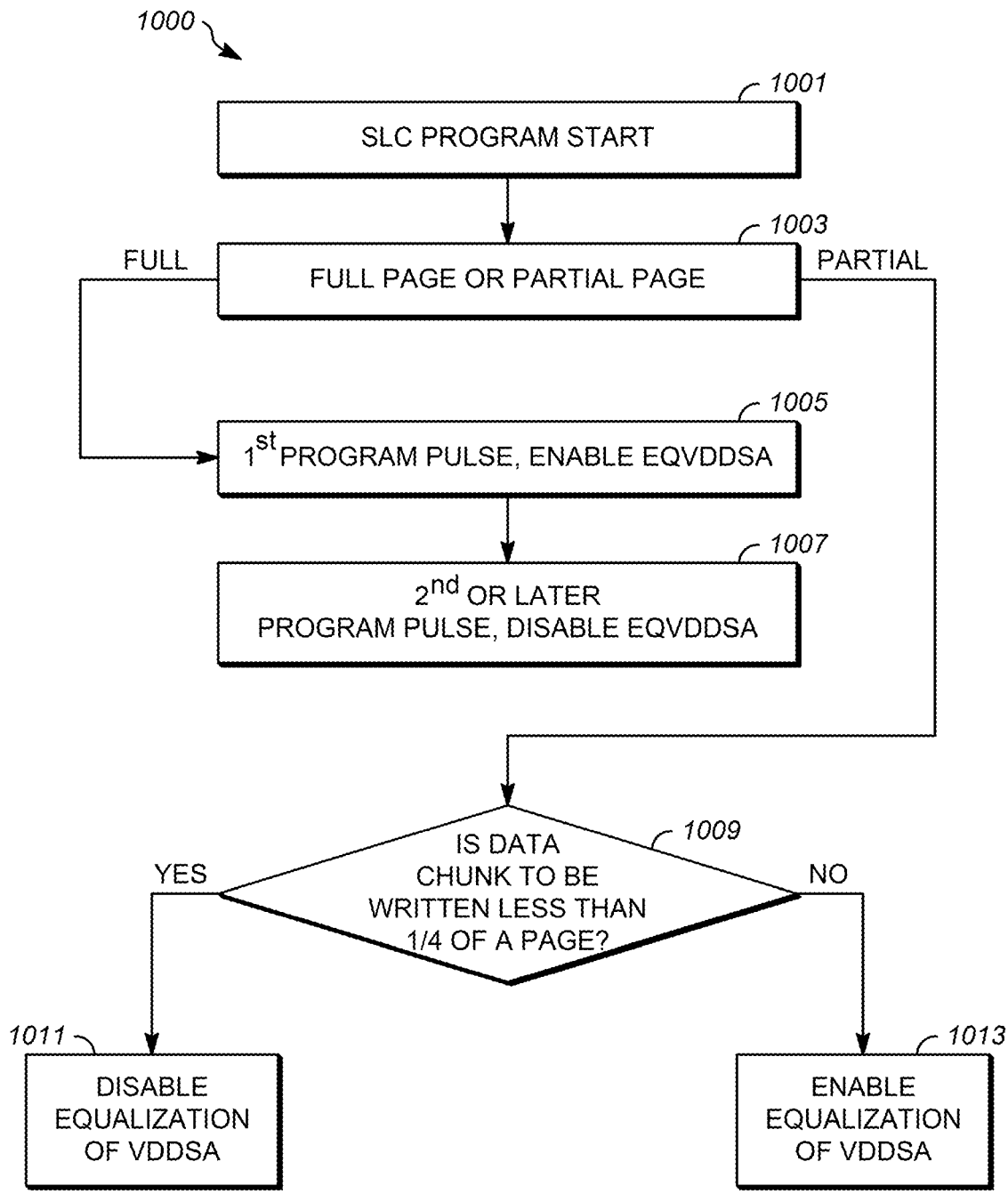
FIG. 10 illustrates a memory process according to an example embodiment.

FIG. 10 shows a method 1000 of adjusting bit line discharge during a single level cell program operation in a nonvolatile memory device. When a programming operation starts, the data to be programmed is randomly distributed. Statistically, during a SLC program, the beginning program data is half (e.g., 50%) zeros and half (50%) ones. The controller circuitry can control the state (enable or disable) of the EQVDDSA based on SLC program pulse number. For the first program pulse, the program data matches the beginning data, half zeros and half ones. EQVDDSA being enabled results in a better discharge result. However, for subsequent pulses, most of the memory cells already locked out (inhibit from programming) as there are very few zero states left in the data to be programmed. Now EQVDDSA is disabled to save Icc (power).

In the case of SLC partial page program EQVDDSA enable or disable can be controlled. The memory controller may only call for a partial page program in chunks of 4K data or 8K. The partial page program with 4K data and with random pattern results in only about one-sixth of the memory cells at zero (12.5% cells at 0 level). Here the method should disable equalization. (EQVDDSA disabled). The partial page write with 8K data with a random pattern, contains about one-quarter (25%) cells at zero. Here, the method should enable equalization (EQVDDSA is enabled).

At step 1001, a single level cell programming operation starts. The programming operation can include a series of programming pulses, which increase in voltage with each successive pulse. Verify operations and signals are intermediate the programming pulses to read the data programmed to verify that the memory cell is programmed to the correct voltage level. If the SLC is at the correct level, e.g., above the threshold voltage, then the bit line for than memory cell changes from program (VSS or zero) to inhibit (VDDSA or one).

At step 1003, the controller determines if the program is for a full page or a partial page. If a full page, the method moves to step 1005. If a partial page, the method moves to step 1009.

At step 1005, the first program pulse is applied with the equalizing of the bit lines to VDDSA occurring after the programming, e.g., subsequent to the programming pulse, e.g., during verify operations.

At step 1007, for second or subsequent programming pulses, the EQVDDSA is disabled.

At step 1009, it is determined if the data chunk to be written is one quarter or less relative to a whole page. If a quarter or less than a whole page, equalization of VDDSA (EQVDDSA) is disabled at step 1011. If greater than one-quarter of a page, equalization of VDDSA is enabled.

Figure 11:
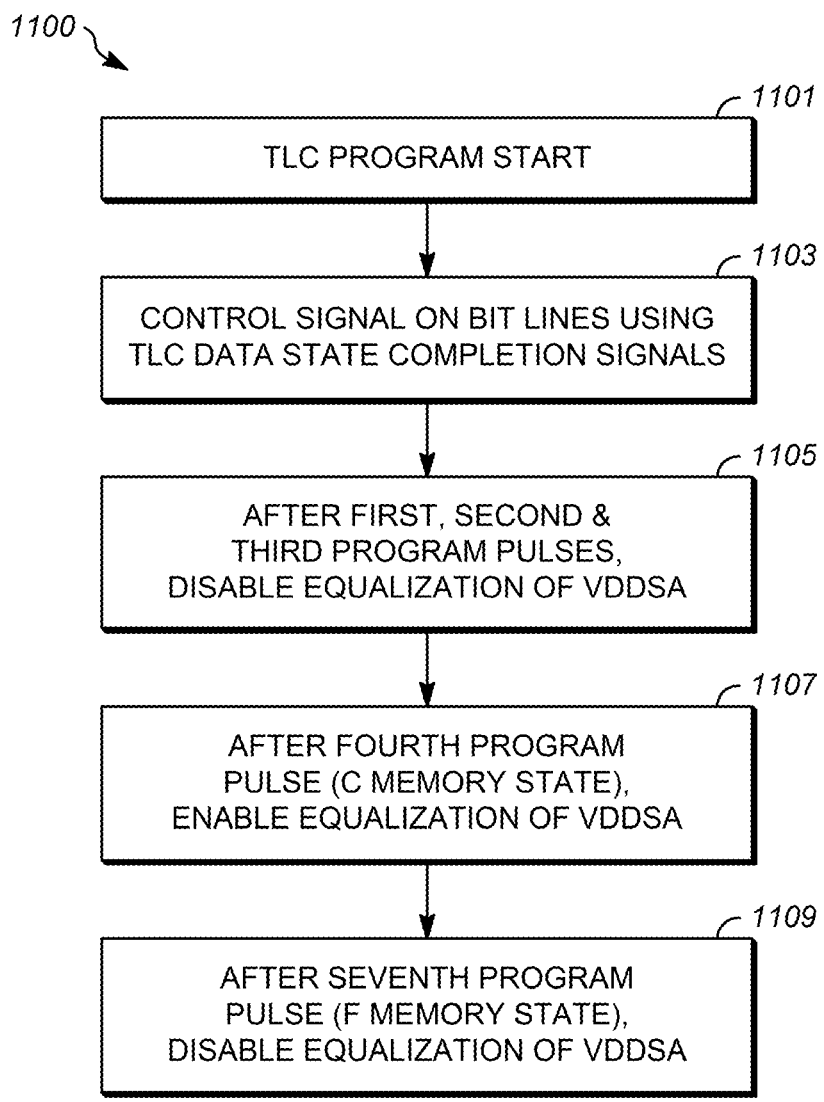
FIG. 11 illustrates a memory process according to an example embodiment.

FIG. 11 shows a method 1100 of adjusting bit line discharge during a triple level cell (TLC) program operation in a nonvolatile memory device. In a TLC full sequence program, cells are programed to one of Er, A, B, C, D, E, F, G states. Er is the erase state, and A-G are programmed memory states at increasing threshold voltages. With fully randomized user data, each state has statistically 12.5% of total cell count. The decision to enable or disable EQVDDSA can be based on TLC data completion signals. For the first program pulse, the bit line inhibit or program is composed of 87.5% of zeros (program) and 12.5% of ones (inhibit). EQVDDSA should be disabled to prevent early equalization, which leads to disturb and high Icc consumption. In an example embodiment, after the program pulse for the C state (or the program loop for the C state) is complete, the state of the memory cells is likely to be half programmed to their correct state with about half lockout. At this point, about half of the memory cells are ones and half are zeros. Now EQVDDSA will give better discharge result and is enabled. In an example embodiment, after F program is complete, about five-eighths (or 87.5%) are programmed to ones and one-eighth (or 12.5%) are zeros on the bit line. Here, EQVDDSA can disabled again to save ICC because equalization is not needed. In an example embodiment, finer control can also be done with program loop based options.

At step 1101, a triple level cell program starts. In a TLC full sequence program, cells are programmed to Er, A, B, C, D, E, F, and G states, with each having a one-eighth chance of occurring with random data.

At 1103, the control circuitry produces control signals on the bit lines using the TLC data state. The bit line signals have voltage levels that are dependent on the number of pulses that have been executed for programming.

At 1105, after the first, second and third program pulses, the equalization of the bit lines is disabled, e.g., EQVDDSA is disabled.

At 1107, after the fourth program pulse, (e.g., after programming the C state) the equalization of the bit line voltage is enabled, e.g., EQVDDSA is enabled.

At 1109, after the seventh program pulse (e.g., after the F program state), the equalization of the bit line voltage is disabled, e.g., EQVDDSA is disabled. This will save power, e.g., Icc.

Figure 12:
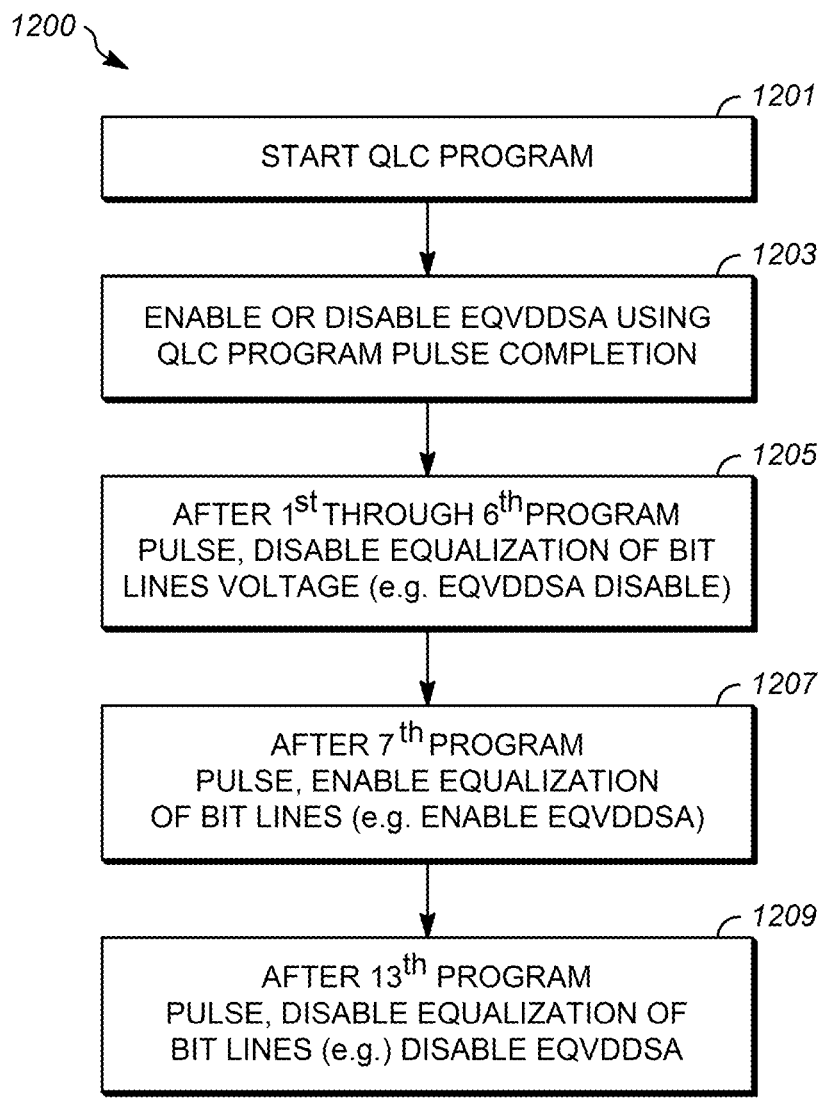
FIG. 12 illustrates a memory process according to an example embodiment.

FIG. 12 shows a method 1200 of adjusting bit line discharge during a quad level cell (QLC) program operation in a nonvolatile memory device. In an example, the QLC program can include a foggy/fine sequence program. In QLC foggy/fine sequence program, cells are programed to Er, S1 to S15 states. With fully randomized user data, each state has 6.25% of total cell count. In this example method 1200, the enable or disable EQVDDSA can be based on QLC data completion signals. Starting with the first program pulse, the bit line values are 93.75% zeros (program) and 6.25% ones (inhibit) for a random data set. EQVDDSA should be disabled to prevent early equalization caused disturb and high Icc. After S7 program pulse is complete about 50% of the cells lockout, and half are ones (inhibit) and half are zeros (program), equalizing the bit line signal to VDDSA (i.e., EQVDDSA operation with EQVDDSA enabled) will provide a better discharge result. After S13 completes, about seven-eighths are inhibited (e.g., ones) on the bit lines and one-eighth are programmed (e.g., zeros). Here EQVDDSA should be disabled again to save ICC because equalization is not needed. Finer control can also be done with program loop based operations.

At step 1201, a QLC program operation is started.

At step 1203, the equalization of the voltage on the bit lines is controlled between the enable and disable states based on the completion of the program pulse.

At step 1205, the equalization on the bit lines (e.g., EQVDDSA) is disabled after the first program pulse (e.g., for 50) through the end of the sixth program pulse (e.g., S5).

At step 1207, the equalization on the bit lines (e.g., EQVDDSA) is enabled after the seventh program pulse.

At step 1209, after the thirteenth program pulse, disable equalization of the bit lines (e.g., EQVDDSA).

Figure 13:
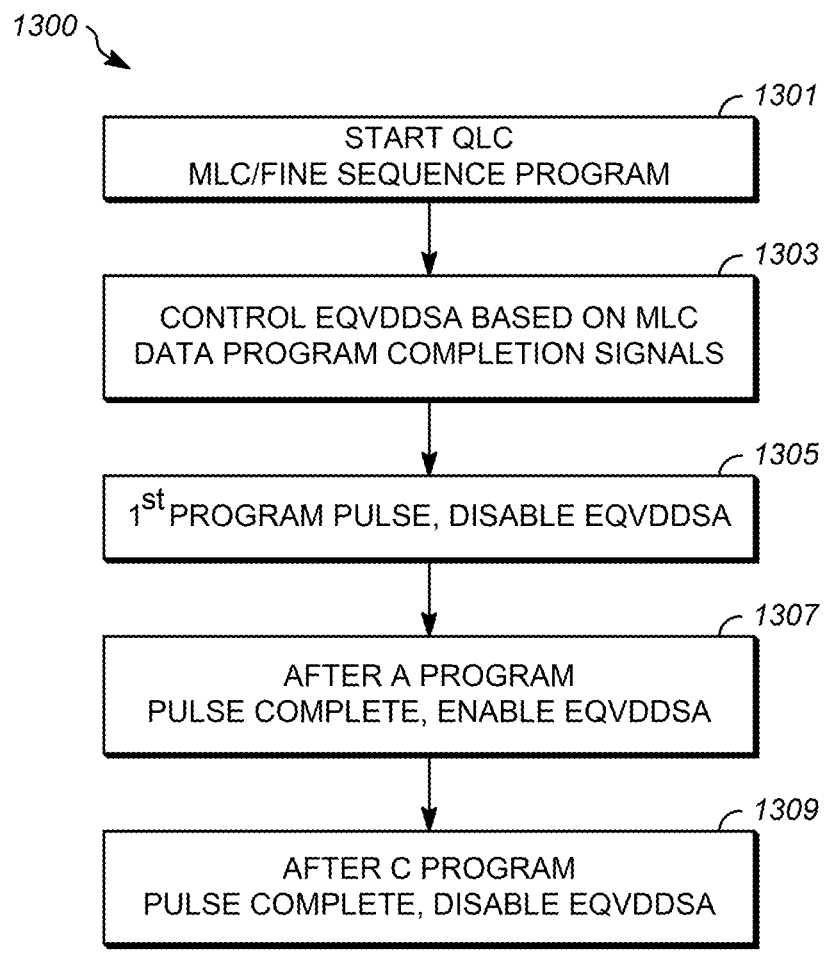
FIG. 13 illustrates a memory process according to an example embodiment.

FIG. 13 shows a method 1300 of adjusting bit line discharge during a quad level cell (QLC) program operation using multilevel cell/fine programming in a nonvolatile memory device (1301). In a QLC MLC/fine sequence programming operation, an MLC stage should be considered separately wherein the memory cells are left in the Er state or are programmed to the A, B, and C states. With fully randomized user data, each state has one-quarter of total cell count. The enable/disable of bit line equalization (e.g., EQVDDSA) is based on MLC data completion signals.

At step 1305, after the first program pulse, three-quarters of memory cells are of zeros (bit line program) and one quarter are ones (bit line inhibit). EQVDDSA should be disabled to prevent early equalization leading to disturb and high Icc use.

At step 1307, after state A is complete, then half the cells lockout, with half being inhibited (ones) and half are programmed (zeros), equalization of the bit lines is enabled (enable EQVDDSA), which should give a better discharge result.

At step 1309, after the state C program pulse is complete, then three-quarters of the memory cells are programmed (bit line inhibit) and one-quarter are not programmed (bit line program). Now the equalization of the bit lines (e.g., EQVDDSA) should be disabled again to save power, e.g, Icc, because equalization is not needed. Finer control can also be done with program loop based options.

Figure 14:
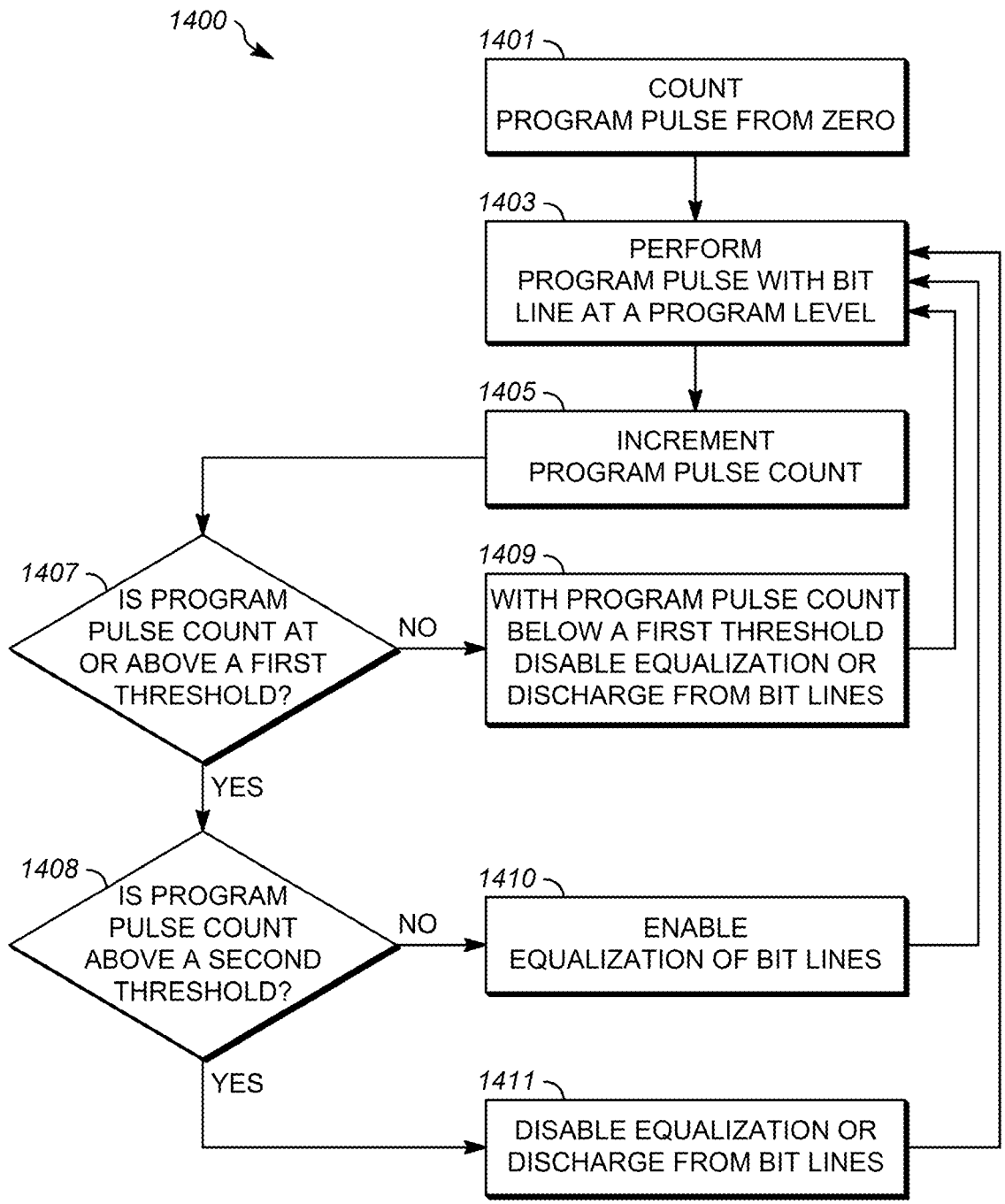
FIG. 14 illustrates a memory process according to an example embodiment.

FIG. 14 shows a method 1400 for controlling signals on the bit lines during a programming operation. At step 1401 the program pulse count is set to zero.

At step 1403, a program pulse operation is performed with at least one bit line at a program level, other bit lines can be an inhibit level (Vss) or a program level (VDDSA).

At step 1405, the program pulse count is incremented.

At step 1407, it is determined whether the program pulse count is at or above a first threshold (e.g., the change from disable to enable as discussed above). If not above a threshold the method moves to step 1409. If the pulse count exceeds the first threshold, then the process moves to step 1408 whereat it is checked if the program pulse count exceeds a second threshold. If no, then at step 1410 the equalization of the bit lines is enabled and the method goes to the next program pulse at 1403.

At step 1409, the equalization of the bit lines is disabled, and the process returns to step 1403.

At step 1411, the equalization at the bit lines is disabled or the discharge of the bit lines is inhibited. After the change of operation of the bit line equalization at step 1411, the process can return to step 1403 unless the program pulse count is at its highest value, e.g., when all of the program levels has occurred. If the program count is maxed then the method 1400 ends.

Figure 15:
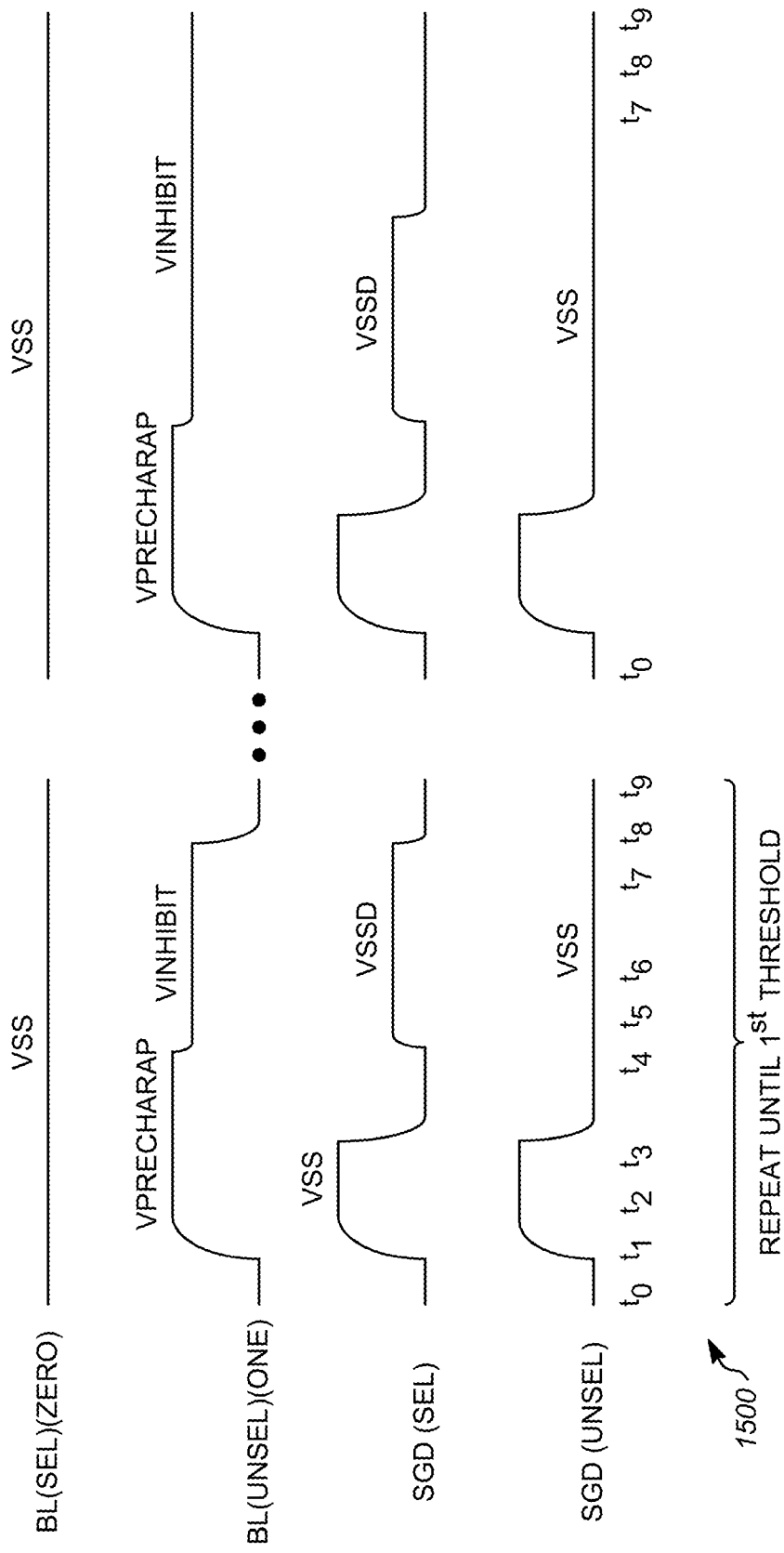
FIG. 15 illustrates a simplified timing diagram according to an example embodiment.

FIG. 15 shows a simplified timing diagram 1500 for some control signals, specially, the bit lines selected (BL sel) for program (herein referred to as zeros or program) and the bit lines unselected or inhibited. In an example embodiment, the Vinhibit shown in diagram 1500 can be the same as VDDSA as used herein. The first group of signals can be used and repeated until a first program pulse threshold is reached. Thereafter the EQVDDSA is enabled and the bit lines that are inhibited do not follow the same pattern as the ones with EQVDDSA disabled. A full timing diagram can be found in U.S. Patent Publication No. 2020/0321055, which is hereby incorporated by reference in its entirety. However if any part of U.S. Patent Publication No. 2020/0321055 conflicts with the present disclosure, then the present disclosure controls.

Figures 16, 17:
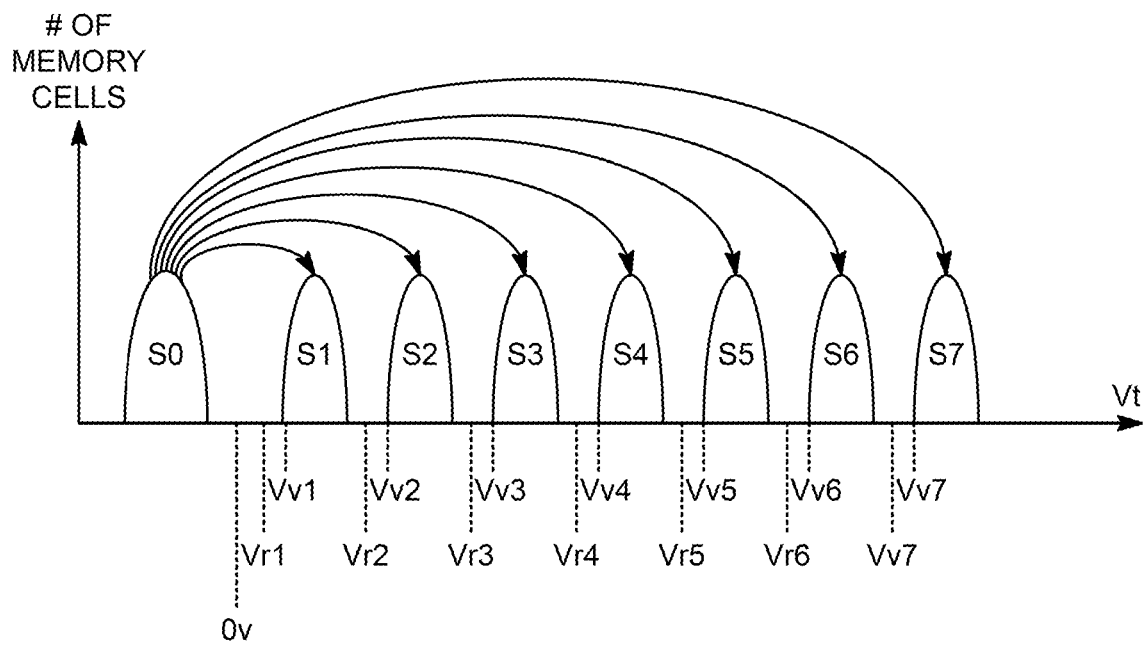
FIG. 16 illustrates threshold voltage distributions for a memory cell.
FIG. 17 illustrates a table describing one example of an assignment of data values to data state.

FIG. 16 shows seven read reference voltages, Vr1, Vr2, Vr3, Vr4, Vr5, Vr6, and Vr7, for reading data from TLC memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 16 also shows seven verify reference voltages, Vv1, Vv2, Vv3, Vv4, Vv5, Vv6, and Vv7. When programming memory cells to data state 51, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 16 represent the full sequence programming. The technology described herein can also be used with other types of programming in addition to full sequence programming (including, but not limited to, multiple stage/phase programming). In some embodiments, data states S1-S7 can overlap, with controller 122 relying on error correction coding (ECC) to identify the correct data being stored.

FIG. 17 is a table describing one example of an assignment of data values to data states. In the table of FIG. 17, S0=111, S1=110, S2=200, S3=000, S4=010, S5=011, S6=001, and S7=101. Other encodings of data can also be used. No particular data encoding is required by the technology disclosed herein.

In an embodiment, when a block is subjected to an erase operation, all memory cells are moved to data state S0, the erased state. As discussed further below, when the memory structure allows sub-block, erase selected sub-blocks of a physical block are erased while non-selected sub-blocks are not. In the embodiment of FIG. 17, all bits stored in a memory cell are 1 when the memory cells is erased (e.g., in data state S0).

Figures 18, 19:
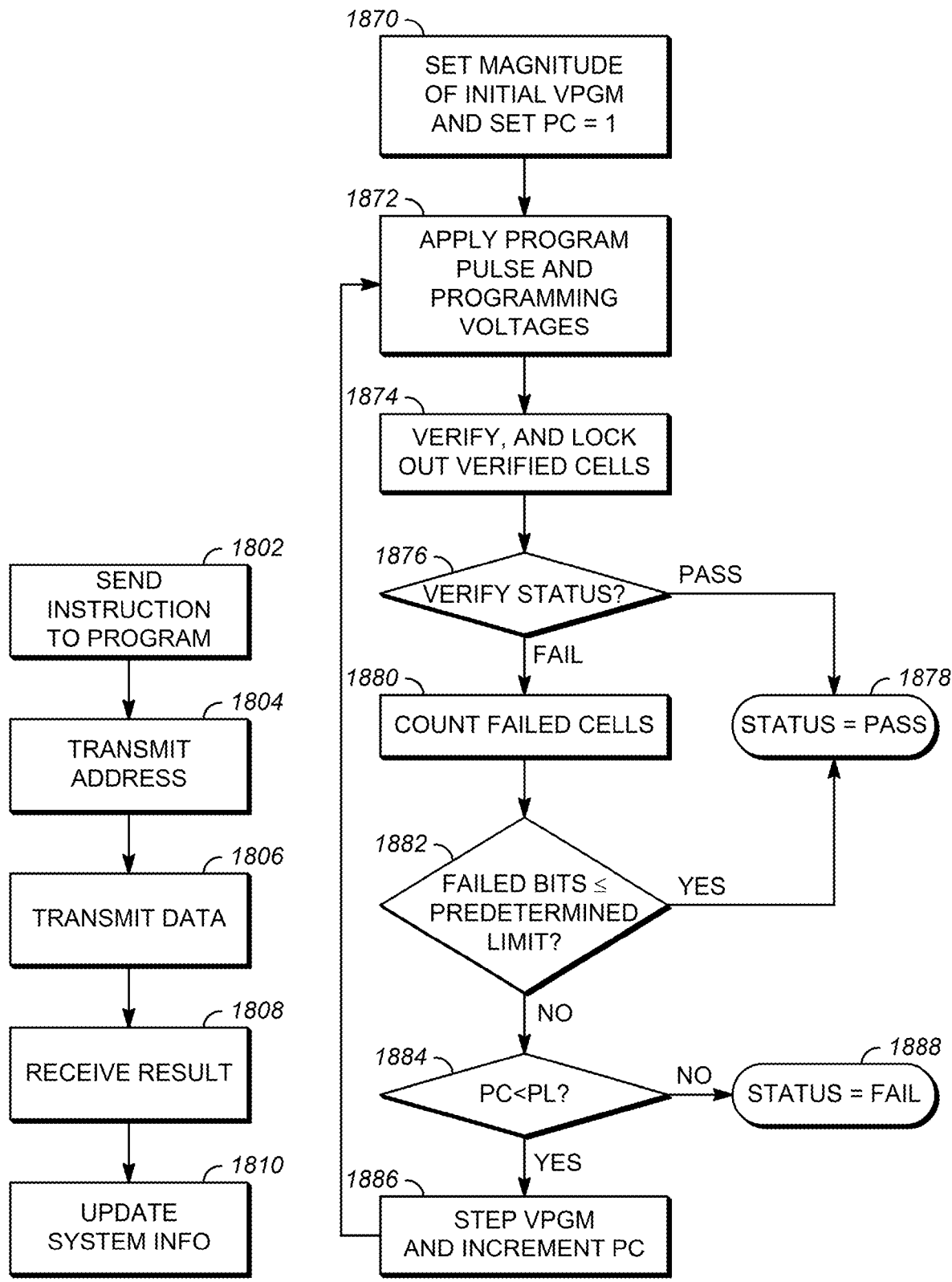
FIG. 18 is a flow chart describing one embodiment of a process for programming.
FIG. 19 is a flow chart describing one embodiment of a process for programming data into memory cells connected to a common word line.

FIG. 18 is a flowchart describing one embodiment of a process for programming that is performed by controller circuitry. In some embodiments, rather than having a dedicated controller, the host can perform the functions of the controller circuitry. In step 1802, the controller circuitry sends instructions to one or more memory die to program data. In step 1804, the controller circuitry sends one or more addresses to one or more memory die. The one or more logical addresses indicate where to program the data. In step 1806, the controller circuitry sends the data to be programmed to the one or more memory die. In step 1808, the controller circuitry receives a result of the programming from the one or more memory die. Example results include that the data was programmed successfully, an indication that the programming operation failed, and indication that the data was programmed but at a different location, or other result. In step 1810, in response to the result received in step 1808, the controller circuitry updates the system information that it maintains. In an embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 1802, the controller circuitry would receive host data and an instruction to program from the host, and the controller would run an error correction code engine to create code words from the host data, as known in the art and described in more detail below. These code words are the data transmitted in step 1806. The controller circuitry can also scramble the data to achieve wear leveling with respect to the memory cells.

FIG. 19 is a flowchart describing one embodiment of a process for programming. The process of FIG. 19 is performed by the memory die in response to the steps of FIG. 18 (i.e., in response to the instructions, data and addresses from controller circuitry). In an example embodiment, the process of FIG. 19 is performed on the memory die circuitry using the one or more control circuits discussed above, at the direction of state machine. The process of FIG. 19 can also be used to implement the full sequence programming discussed above, inclusive or enabling equalization of the programming voltage (Vddsa) from the sense amplifier data latch on the bit lines after at least the first program pulse or the first programming loop for SLC program and disabling equalization of the programming voltage (Vddsa) after the first programming pulse or programming loop. The process of FIG. 19 can also be used in multilevel cell programming as described herein and include enabling equalization of the programming voltage (Vddsa) until at least half or more than half of the bit lines enter the inhibit stage and then disabling the equalization of the programming voltage (Vddsa) on the bit lines. Additionally, the process of FIG. 19 can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size.

At step 1870 of FIG. 19, the programming voltage (Vpgm) is initialized to the starting magnitude (e.g., about 12.0-16.0V or another suitable level) and a program counter (PC) maintained by the state machine is initialized at a 1 value.

At step 1872, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., about 7-11 volts) to perform boosting schemes. If a memory cell should be programmed, then the corresponding bit line is grounded. On the other hand, if the memory cell should remain at its current threshold voltage, then the corresponding bit line is connected to Vdd to inhibit programming. At step 1872, the program pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

At step 1874, the appropriate memory cells are verified using the appropriate set of verify reference voltages to perform one or more verify operations. In an embodiment, the verification process is performed by applying the testing whether the threshold voltages of the memory cells selected for programming have reached the appropriate verify reference voltage.

At step 1876, it is determined whether all the memory cells have reached their target threshold voltages (pass). If so, the programming process is complete and successful because all selected memory cells were programmed and verified to their target states. A status of "PASS" is reported in step 1878. If, at 1876, it is determined that not all of the memory cells have reached their target threshold voltages (fail), then the programming process continues to step 1880.

At step 1880, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

At step 1882, it is determined whether the count from step 1880 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 1878. In this situation, enough memory cells programmed correctly such that the few remaining memory cells that have not been completely programmed can be corrected using ECC during the read process. In some embodiments, step 1880 will count the number of failed cells for each sector, each target data state or other unit, and those counts will individually or collectively be compared to a threshold at step 1882.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If a number of failed memory cells is not less than the predetermined limit, than the programming process continues at step 1884 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 1888. This is one example of a program fault. If the program counter PC is less than the program limit value PL, then the process continues at step 1886 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 1886, the process loops back to step 1872 and another program pulse is applied to the selected word line so that another iteration (steps 1872-1886) of the programming process of FIG. 19 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 16) or verify operation (e.g. see verify reference voltages Vv1, Vv2, Vv3, Vv4, Vv5, Vv6, and Vv7 of FIG. 16) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller circuitry receives a request from the host (or a client, user, etc.) to program host data (data received from the host) into the memory system. In some embodiments, controller circuitry arranges the host data to be programmed into units of data. For example, controller circuitry can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Figure 20:
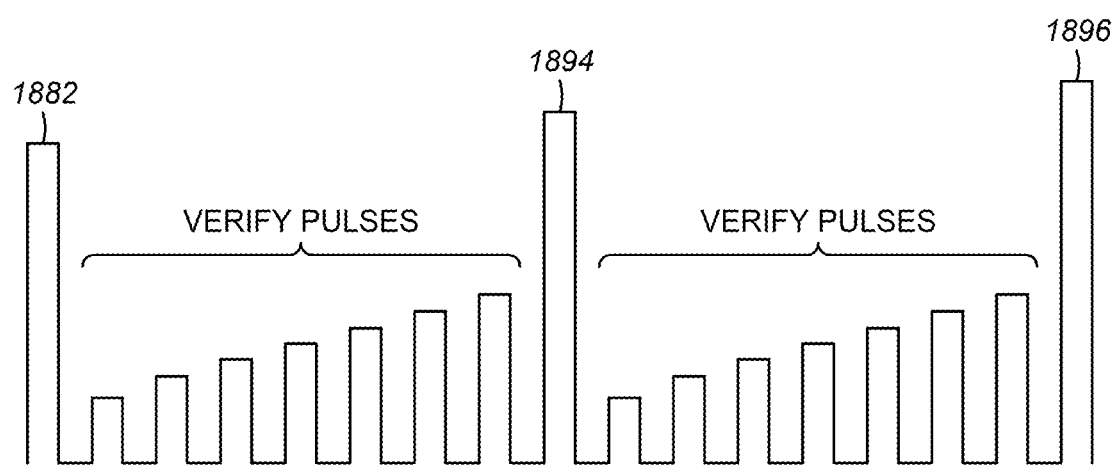
FIG. 20 depicts a word line voltage during programming and verify operations.

Step 1872 of FIG. 19 includes applying a program voltage pulse on the selected word line. Step 1874 of FIG. 19 includes verification, which in some embodiments comprises applying the verify reference voltages on the selected word line. As steps 1872 and 1874 are part of an iterative loop, the program voltage is applied as a series of voltage pulses that step up in magnitude. Between voltage pulses, verify reference voltages are applied. This is depicted in FIG. 20, which shows program voltage pulses 1892, 1894 and 1896, applied during three successive iterations of step 1872. Between program voltage pulses 1892, 1894 and 1896, the system, e.g., the controller circuitry, tests the memory cells to determine whether threshold voltages of the memory cells are greater than the respective verify reference voltages by applying the verify references voltages as verify pulses.

Programming the memory cells as described herein, prior to applying a program pulse at step 1872 of FIG. 19, if a memory cell should be programmed, then the corresponding bit line is grounded. On the other hand, if the memory cell should remain at its current threshold voltage, then the corresponding bit line is connected to a program inhibit level, such as Vdd. In many embodiments, the word lines of an erased block are programmed stating at the source end with word line, e.g., word line WL0. As the other memory cells of the columns between the selected word line and the bit line are erased, this allows for the level on the bit line to be applied to the memory cells of the selected word line uniformly, whereas if any of the intermediate memory cells were programmed, this pre-charging of the memory cells could be blocked. The word lines of the block are then sequentially written in an order working from the source side on the bottom towards the bit lines at the drain end of the NAND strings.

Modules can also be implemented at least partially in software for execution by various types of processors. An identified module of executable code can, for instance, comprise one or more physical or logical blocks of computer instructions which can, for instance, be organized as an object, procedure, or function. Nevertheless, the executables of an identified module need not be physically located together but can comprise disparate instructions stored in different locations which, when joined logically together, comprise the module and achieve the stated purpose for the module.

Indeed, a module of executable code can include a single instruction, or many instructions, and can even be distributed over several different code segments, among different programs, across several memory devices, or the like. Where a module or portions of a module are implemented in software, the software portions can be stored on one or more computer readable and/or executable storage media. Any combination of one or more computer readable storage media can be utilized. A computer readable storage medium can include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium can be any tangible and/or non-transitory medium that can contain or store a program for use by or in connection with an instruction execution system, apparatus, processor, or device.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit or circuitry, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited.

Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
 a plurality of memory cells configured to store multiple states;
 a memory controller operably connected to the plurality of memory cells to control storage of data therein and configured to:
  apply a program control signal to selected bit lines to program selected memory cells of the plurality of memory cells to program the selected memory cells and apply an inhibit control signal to unselected memory cells of the plurality of memory cells to block programming of the unselected memory cells,
  disable an equalization signal applied to the selected bit lines after initial program pulses are applied to the selected memory cells, and
  enable the equalization signal applied to the selected bit lines once a threshold number of program pulses is met.

2. The apparatus of claim 1, wherein the memory controller is configured to set the threshold of program pulses to a number at which at least half of the plurality of memory cells are programmed to respective final memory states.

3. The apparatus of claim 2, wherein the memory controller is further configured to disable the equalization signal to reduce power consumption and reduce inhibit memory cell disturb.

4. The apparatus of claim 1, wherein the memory controller is configured to control programming of a single level cell and disable the equalization signal for a first programming pulse.

5. The apparatus of claim 4, wherein the memory controller is configured to enable bit line equalization after a second programming pulse or a later programming pulse.

6. The apparatus of claim 1, wherein the memory controller is configured to control programming of a single level cell on a partial page by selectively enabling and disabling the equalization signal for predetermined programming pulses.

7. The apparatus of claim 1, wherein the memory controller is configured to control programming of a triple level cell and disable the equalization signal for the first three programming pulses.

8. The apparatus of claim 7, wherein the memory controller is configured to enable the equalization after C level programming is completed.

9. The apparatus of claim 8, wherein the memory controller is configured to disable the equalization after F level programming is completed.

10. The apparatus of claim 1, wherein the memory controller is configured to control programming of a quad level cell, disable the equalization signal for at least a first programming pulse, enable the equalization signal after S7 programming is completed, and disable the equalization signal after S13 programming is completed.

11. The apparatus of claim 1, wherein the memory controller is configured to control programming a quad level cell using MLS/fine programming, disable the equalization signal for at least a first programming pulse, enable the equalization signal after A programming is completed, and disable the equalization signal after C programming is completed.

12. A nonvolatile memory control method, comprising:
applying a select control signal to selected bit lines to address selected memory cells of the plurality of memory cells to program the selected memory cells;
applying an inhibit control signal to unselected memory cells of the plurality of memory cells to block programming to the unselected memory cells;
disabling a discharge of the selected bit lines until after initial program pulses are applied to the selected memory; and
enabling a discharge of the selected bit lines once a threshold of program pulses is met.

13. The method of claim 12, wherein the step of enabling a discharge of the selected bit lines includes equalizing the bit lines to VDDSA before discharging the bit lines.

14. The method of claim 12, further comprising setting the threshold of program pulses to a number at which at least half of the memory cells are programmed to respective final memory states.

15. The method of claim 12, further comprising controlling programming a single level cell and wherein disabling the discharge of the selected bit lines includes disabling the discharge for a first programming pulse.

16. The method of claim 12, further comprising the step of controlling programming of a triple level cell and wherein disabling the discharge of the selected bit lines includes disabling discharge of the bit lines for the first three programming pulses.

17. The method of claim 16, wherein the step of enabling the discharge of the selected bit lines further includes enabling the disabled bit lines for discharge after C programming is completed.

18. The method of claim 17, wherein the step of disabling the discharge of selected bit lines further includes disabling the previously enabled bit lines after F programming is completed.

19. A nonvolatile memory control method, comprising:
setting a program pulse count to zero;
performing a program pulse with a bit line at a program level;
incrementing the programming pulse count;
with the programming pulse count below a first threshold, disabling bit line discharge between programming pulses and then performing a subsequent programming pulse by returning performing a program pulse with a bit line at a program level;
with the programming pulse count at or above a first threshold, enabling bit line discharge between programming pulses and then returning performing a program pulse with a bit line at a program level and incrementing the program pulse count; and
with the programming pulse count above a second threshold, disabling bit line discharge between programming pulses.

20. The method of claim 19, wherein performing the programming pulses includes performing programming pulses for a QLC memory, setting the first threshold at the S7 program pulse level and setting the second threshold at the S13 programming pulse level.

* * * * *